United States Patent
Cho

(10) Patent No.: US 10,367,166 B2
(45) Date of Patent: Jul. 30, 2019

(54) DISPLAY DEVICE HAVING DAM WITH PLATE-SHAPED FILLERS

(71) Applicant: LG Display Co., Ltd., Seoul (KR)

(72) Inventor: Dong-Uk Cho, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/990,190

(22) Filed: May 25, 2018

(65) Prior Publication Data

US 2018/0342655 A1 Nov. 29, 2018

(30) Foreign Application Priority Data

May 29, 2017 (JP) ................................. 2017-105603

(51) Int. Cl.
| | | |
|---|---|---|
| H01L 51/52 | (2006.01) | |
| H01L 33/56 | (2010.01) | |
| H01L 33/54 | (2010.01) | |
| H01L 33/50 | (2010.01) | |
| H01L 27/15 | (2006.01) | |

(52) U.S. Cl.
CPC ........ H01L 51/5246 (2013.01); H01L 27/156 (2013.01); H01L 33/502 (2013.01); H01L 33/54 (2013.01); H01L 33/56 (2013.01); H01L 51/525 (2013.01); H01L 51/5259 (2013.01)

(58) Field of Classification Search
CPC ......... H01L 33/52; H01L 33/54; H01L 33/56; H01L 33/502; H01L 27/156; H01L 51/5259; H01L 51/5246; H01L 51/525; C08F 2/44; H05B 33/04
See application file for complete search history.

(56) References Cited

U.S. PATENT DOCUMENTS

| | | | | |
|---|---|---|---|---|
| 6,061,105 A | * | 5/2000 | Nakagawa | G02F 1/1339 349/139 |
| 6,226,890 B1 | * | 5/2001 | Boroson | F26B 21/083 252/194 |
| 7,876,493 B2 | * | 1/2011 | Park | G02F 1/167 359/296 |
| 2007/0145350 A1 | * | 6/2007 | Kobori | H01L 27/322 257/13 |
| 2007/0172971 A1 | * | 7/2007 | Boroson | H01L 51/5246 438/26 |
| 2007/0279571 A1 | * | 12/2007 | Koo | H01L 51/5246 349/153 |
| 2007/0285007 A1 | * | 12/2007 | Lee | H01L 27/3251 313/504 |
| 2008/0238303 A1 | * | 10/2008 | Lee | H01L 51/5246 313/504 |
| 2009/0039780 A1 | * | 2/2009 | Kim | H01J 9/261 313/512 |

(Continued)

FOREIGN PATENT DOCUMENTS

| | | |
|---|---|---|
| JP | 2013-143264 A | 7/2013 |
| JP | 2015-151528 A | 8/2015 |

Primary Examiner — Zandra V Smith
Assistant Examiner — Jeremy J Joy
(74) Attorney, Agent, or Firm — Fenwick & West LLP

(57) ABSTRACT

A display device includes a first substrate; an emitting diode on the substrate; a second substrate on the emitting diode; and a dam between the first substrate and the second substrate and surrounding the emitting diode, wherein the dam include a resin and a plate-shape filler, and the plate-shape filler is arranged to be non-parallel to a surface of the first substrate.

18 Claims, 5 Drawing Sheets

(56) References Cited

U.S. PATENT DOCUMENTS

| | | | |
|---|---|---|---|
| 2011/0062603 A1* | 3/2011 | Hawker | H01L 21/56 257/787 |
| 2011/0304812 A1* | 12/2011 | Hwang | G02F 1/133308 349/155 |
| 2012/0112212 A1* | 5/2012 | Kim | H01L 51/5246 257/88 |
| 2012/0190772 A1* | 7/2012 | Weng | C08K 3/04 523/351 |
| 2013/0266781 A1* | 10/2013 | Hoffmann | C03C 17/42 428/204 |
| 2013/0313535 A1* | 11/2013 | Heo | H01L 51/5064 257/40 |
| 2014/0015769 A1* | 1/2014 | Lee | H01H 9/04 345/173 |
| 2014/0183499 A1* | 7/2014 | Kim | H01L 27/3213 257/40 |
| 2015/0028307 A1* | 1/2015 | Kim | H01L 51/56 257/40 |
| 2015/0372254 A1* | 12/2015 | Shin | H01L 51/5259 257/40 |
| 2017/0148855 A1* | 5/2017 | Kaji | H01L 27/3211 |
| 2017/0179438 A1* | 6/2017 | Xu | H01L 27/3213 |
| 2017/0363891 A1* | 12/2017 | Miyachi | C08F 22/06 |

\* cited by examiner (a)

(b)

DISPLAY DEVICE HAVING DAM WITH PLATE-SHAPED FILLERS

CROSS-REFERENCE TO RELATED APPLICATION

The present application claims the benefit of Japanese Patent Application No. 2017-105603 filed in Japan on May 29, 2017, which is herein incorporated by reference in its entirety.

BACKGROUND

Technical Field

The present disclosure relates to an organic electroluminescent device (display device).

Description of the Related Art

In the organic electroluminescent device, a degradation of an organic material is generated by oxygen and/or moisture such that the emitting efficiency is decreased. To prevent the degradation, the organic material is sealed or encapsulated to prevent the penetration of oxygen and/or moisture.

In a thickness direction of the organic electroluminescent device, an inorganic layer (film) or a metal layer is formed to block the penetration of oxygen and/or moisture. In a side of the electroluminescent device, a periphery of the organic material is sealed by a dam material to block the penetration of oxygen and/or moisture.

For example, Japanese Patent Publication No. 2015-151528 discloses an organic electroluminescent device using a curable composition, which includes a polymeric compound, a filler and a polymerization initiator, for a dam material. In addition, in Japanese Patent Publication No. 2015-151528, by using the curable composition including a surface modified plate-shape inorganic particle as the filler, the discharging amount is accurately controlled when the curable composition is discharged to form the dam material.

SUMMARY

Accordingly, the present disclosure is directed to an organic electroluminescent device that substantially obviates one or more of the problems due to limitations and disadvantages of the related art, and have other advantages.

Additional features and embodiments of the present disclosure will be set forth in the description which follows, and will be apparent from the description. These and other technological improvements of the present disclosure will be realized and attained by the structure particularly pointed out in the written description and claims hereof as well as the appended drawings.

As embodied and broadly described herein, the present disclosure provides a display device that includes a substrate (which may be referred as a first substrate in the present disclosure)); an emitting diode on the substrate; a counter substrate (which may be referred as a second substrate in the present disclosure) on the emitting diode; and a dam between the first substrate and the second substrate and surrounding the emitting diode, wherein the dam include a resin and a plate-shape filler, and the plate-shape filler is arranged to be non-parallel to a surface of the first substrate.

In another embodiment, the present disclosure provides a method of fabricating an organic electroluminescent device that includes forming an emitting diode on a substrate; forming a dam material pattern on the substrate at a periphery of the emitting diode by coating a dam material solution, the dam material solution including a resin and a plate-shape filler; disposing a counter substrate on the dam material pattern; and forming a dam by curing the dam material pattern, wherein the plate-shape filler in the dam is arranged to be non-parallel to a surface of the substrate.

In another embodiment, the present disclosure provides a method of fabricating an organic electroluminescent device that includes forming an emitting diode on a substrate; forming a metal layer on the emitting diode; forming a dam material pattern on the substrate at a periphery of the emitting diode and a side of the metal layer by coating a dam material solution, the dam material solution including a resin and a plate-shape filler; and forming a dam by curing the dam material pattern, wherein the plate-shape filler in the dam is arranged to be non-parallel to a surface of the substrate.

The foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

DETAILED DESCRIPTION

As mentioned above, Japanese Patent Publication No. 2015-151528 discloses the organic electroluminescent device using a dam material to block the penetration of oxygen and/or moisture. However, to sufficiently block the penetration of oxygen and/or moisture, it is necessary to increase a width, i.e., a thickness along a plane direction, of the dam material. On the other hand, to decrease a non-display area, a size and a weight of the organic electroluminescent device and improve the design of the organic electroluminescent device, it is desired that the width of the dam material is narrowed. Namely, a narrow bezel structure is required.

Accordingly, the blocking property of the penetration of oxygen and/or moisture and the narrow bezel structure have a trade-off relation.

The present disclosure provides an organic electroluminescent device having a narrow bezel structure and being capable of sufficiently blocking the penetration of oxygen and/or moisture and a method of fabricating the organic electroluminescent device.

Reference will now be made in detail to the disclosed embodiments, examples of which are illustrated in the accompanying drawings.

Figure 1:
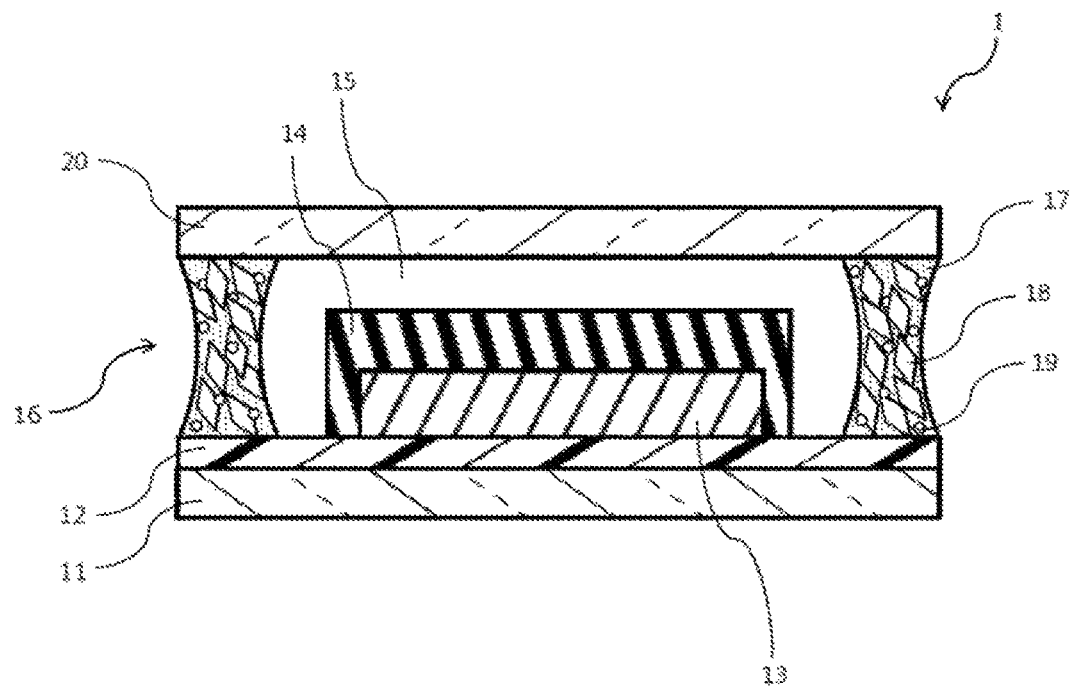
FIG. 1 is a schematic cross-sectional view of an organic electroluminescent device according to a first embodiment of the present disclosure.
Figure 2:
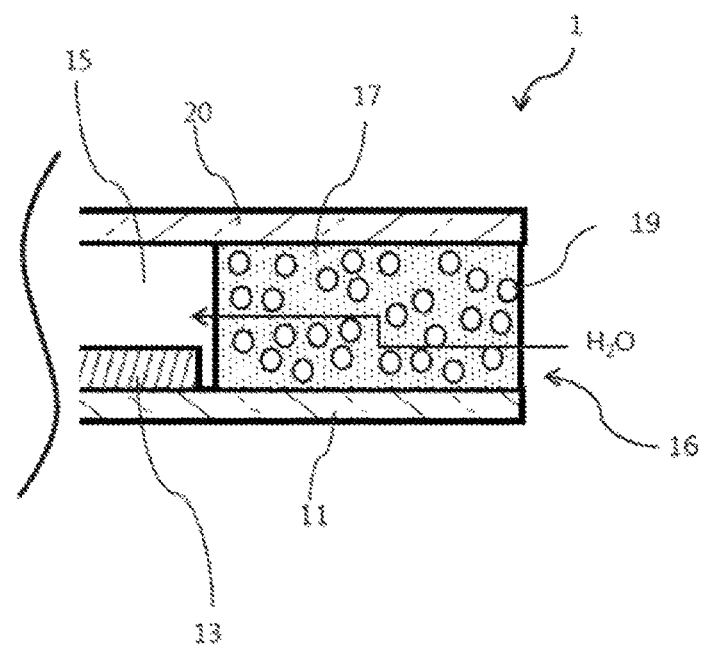
FIG. 2 is a schematic cross-sectional view illustrating moisture penetration in the related art organic electroluminescent device according to an embodiment.

FIG. 1 is a schematic cross-sectional view of an organic electroluminescent device according to a first embodiment of the present disclosure. FIG. 2 is a schematic cross-sectional view illustrating moisture penetration in the related art organic electroluminescent device, and FIG. 3 is a schematic cross-sectional view illustrating moisture penetration in an organic electroluminescent device according to the first embodiment of the present disclosure.

An organic electroluminescent device (display device) 1 of FIG. 1 is a top-emission type device. Alternatively, the organic electroluminescent device 1 may be a bottom-emission type device.

Figure 3:
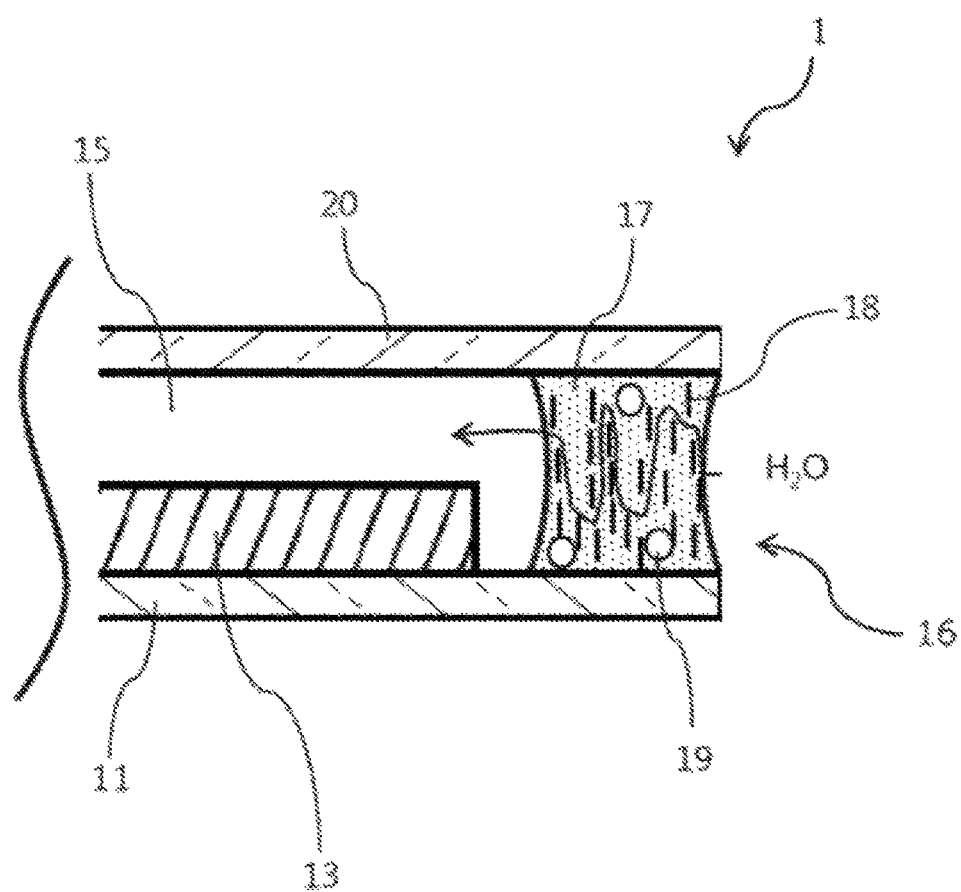
FIG. 3 is a schematic cross-sectional view illustrating moisture penetration in an organic electroluminescent device according to the first embodiment of the present disclosure.

With reference to FIGS. 2 and 3, a mechanism of blocking the penetration of oxygen and/or moisture is explained. In FIGS. 2 and 3, the organic electroluminescent device 1 is shown without a barrier layer 12 (of FIG. 1) and a passivation layer 14 (of FIG. 1).

As shown in FIG. 2, a dam 16 includes a resin 17 and a getter 19 having a sphere shape. Since the getter 19 has the sphere shape, the effect of blocking moisture is decreased when moisture moves (penetrates) along a vertical direction to a cross section of the organic electroluminescent device 1 (i.e., a left direction in FIG. 2). Namely, moisture penetrates with a substantially minimum path in the dam 16 such that the blocking property against moisture is lowered. To provide sufficient blocking property, it is necessary to increase the thickness of the dam 16 along a width direction (i.e., a left-right direction in FIG. 2). Accordingly, to provide sufficient blocking property, the narrow bezel characteristic is deteriorated. In the related art organic electroluminescent device, the width of the bezel is equal to or greater than 4.5 mm.

On the other hand, in the present disclosure, a dam 16 in the organic electroluminescent device 1 further includes a plate-shape filler 18. Namely, the dam 16 includes a resin 17 and the plate-shape filler 18, and optionally further includes a getter 19. The plate-shape filler 18 is aligned (or arranged) to be non-parallel to a vertical direction to a cross section of the organic electroluminescent device 1 (i.e., a left-right direction in FIG. 3). Namely, the plate-shape filler 18 is obliquely or vertically aligned to a top surface of a substrate 11. In other words, a major axis of the plate-shape filler 18 is non-parallel to the top surface of the substrate 11. In FIG. 3, the plate-shape filler 18 is vertically aligned with respect to the vertical direction to the cross section of the organic electroluminescent device 1. Since the plate-shape filler 18 does not have a sphere shape, moisture is effectively or sufficiently blocked when moisture penetrates into an enclosed space where an emitting diode 13 is positioned. Accordingly, moisture penetrates with non-minimum path, which is longer than the minimum path, in the dam 16 such that moisture is effectively blocked with the dam 16 having small width. Namely, a bezel of the organic electroluminescent device 1 is decreased. (narrow bezel)

<Organic Electroluminescent Device 1>

The organic electroluminescent device 1 of the present disclosure includes a substrate 11, an emitting diode 13 on or over the substrate 11, a counter substrate 20 on or over the emitting diode 13 and a dam 16 sealing (or encapsulating) a periphery of the emitting diode 13. The dam 16 includes the resin 17 and the plate-shape filler 18. The plate-shape filler 18 is aligned to be non-parallel with respect to the vertical direction of the cross section of the organic electroluminescent device 1, i.e., the top surface of the substrate 11.

The dam 16 may further include the getter 19. A barrier layer 12 may be disposed on the top surface of the substrate 11. Namely, the barrier layer 12 may be positioned between the substrate 11 and the emitting diode 13. A passivation layer 14 may be disposed on a top surface and a side surface of the emitting diode 13, and a filler layer 15 may fill a space surrounded by the dam 16, the substrate 11 and the counter substrate 20. The passivation layer 14 may have a single-layered structure of an inorganic layer. Alternatively, the passivation layer 14 may have a triple-layered structure of a first inorganic layer, an organic layer and a second inorganic layer sequentially stacked such that the passivation layer 14 may serve as an encapsulation layer (or film). The filler layer 15 may include the plate-shape filler. In this instance, the plate-shape filler in a region of the filler layer 15 at a lateral side of the emitting diode 13 is aligned to be non-parallel with respect to the vertical direction of the cross section of the organic electroluminescent device 1, while the plate-shape filler in a region of the filler layer 15 at a front side of the emitting diode 13 is aligned to be non-parallel with respect to the cross section of the organic electroluminescent device 1.

Figure 4:
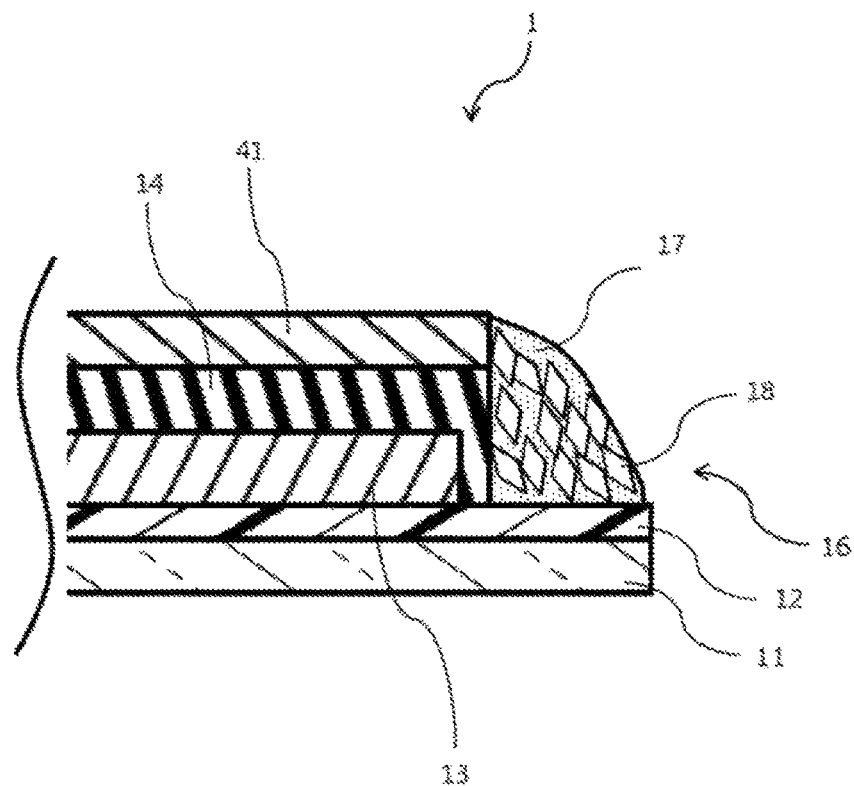
FIG. 4 is a schematic cross-sectional view of an organic electroluminescent device according to a second embodiment of the present disclosure.

In FIG. 1, the dam 16 is disposed between the substrate 11 and the counter substrate 20, but it is not limited thereto. The dam 16 is required to seal a periphery (a lateral side) of the emitting diode 13. For example, as shown in FIG. 4, the dam 16 may seal a lateral side of both a counter substrate (metal layer) 41 and the emitting diode 13.

The elements of the organic electroluminescent device 1 are explained in more detail.

<Substrate 11>

The emitting diode 13 is formed on the substrate 11. For example, the substrate 11 may be a glass substrate or a plastic substrate, but it is no limited thereto.

<Barrier Layer 12>

The barrier layer 12 is formed on the substrate 11. The barrier layer 12 has a blocking property against oxygen and/or moisture, and there is no limitation on a material of the barrier layer 12. For example, an insulating material, such as silicon oxide, silicon nitride and aluminum oxide, may be used for the barrier layer 12. The barrier layer 12 may has a single-layered structure or a multi-layered (at least two layers) structure.

Although not shown, a thin film transistor (TFT) layer including a TFT constituting a driving circuit for driving the emitting diode 13 may be formed on the barrier layer 12.

<Emitting Diode 13>

The emitting diode 13 is formed on or over the TFT layer. The emitting diode 13 may include an anode, an organic compound layer (organic emitting layer) on the anode and a cathode on the organic compound layer. The organic compound layer may include a hole injection layer, a hole transporting layer, an emitting material layer, an electron transporting layer and an electron injection layer sequentially stacked on the anode.

Each layer of the emitting diode 13 may be formed by well-known materials.

For example, the anode may be a reflective electrode of a thin film formed of high reflective material, e.g., aluminum, silver, platinum or chromium. In addition, a thin film of a transparent conductive oxide material, e.g., indium-tin-oxide (ITO) or indium-zinc-oxide (IZO), may be further formed on the high reflective material thin film.

The organic compound layer may include a red (R) organic compound layer, a green (G) organic compound layer and a blue (B) organic compound layer in each sub-pixel of a pixel. The red, green and blue organic compound layer may be formed of well-known materials.

The cathode may be a semi-transparent electrode or a transparent electrode of a thin film formed of silver, silver alloy, ITO or IZO.

<Passivation Layer 14>

The passivation layer 14 is formed on the emitting diode 13. The passivation layer 14 is formed at an upper surface and a side surface of the emitting diode 13 to cover the emitting diode 13.

The passivation layer 14 includes an inorganic layer having low moisture permeability and serves as a protection layer protecting the emitting diode 13 from moisture and/or oxygen. For example, the passivation layer 14 may be a silicon oxide layer or a silicon nitride layer. Alternatively, the passivation layer 14 has a multi-layered structure including a first inorganic layer, an organic layer and a second inorganic layer sequentially stacked such that the passivation layer 14 may serve as an encapsulation layer (or film).

<Dam 16>

The dam 16 is formed on the barrier layer 12 at a periphery of the emitting diode 13 to surround edges of a panel including the emitting diode 13. Namely, the dam 13 surrounds a display region, where a plurality of emitting diodes 13 arranged in a matrix are positioned, of the organic electroluminescent device 1.

Over the substrate 11, where the dam 16 is formed, the counter substrate 20 is disposed, and the counter substrate 20 is fixed to face the substrate 11 by the dam 16. Namely, the dam 16 is disposed between the substrate 11 (or the barrier layer 12) and the counter substrate 20, and an enclosed space is formed by the dam 16, the substrate 11 and the counter substrate 20. The emitting diode 13 is sealed in the enclosed space.

The dam 16 includes the resin 17 and the plate-shape filler 18. The dam 16 may further include the getter 19 and an elastic spacer 71 (of FIG. 8).

The dam 16 have a width being equal to or less than 3 mm, beneficially equal to less than 2 mm, and more beneficially equal to less than 1 mm. With the dam 16 having the width equal to or less than 3 mm, the bezel of the organic electroluminescent device 1 is decreased such that the non-display region, the size and the weight are further decreased and the design is further improved.

The width of the dam 16 is a length of the dam 16 in the vertical direction to the cross section of the organic electroluminescent device 1. In other words, the width of the dam 16 is a length in a direction being perpendicular to an extension direction and being parallel to a main surface (top surface) of the substrate 11. In FIG. 1, the width of the dam 16 is a length of the dam 16 in a left-right direction (horizontal direction).

<Resin 17>

The resin 17 may be a thermosetting resin or a photo-curable resin. For example, the resin 17 may be epoxy resin or acryl resin.

In addition, to efficiently align the plate-shape filler 18 in a desired direction, a liquid crystal monomer or an azo-benzene compound as an aligning agent may be added into the resin 17. Namely, the resin 17 may further include the liquid crystal monomer or the azo-benzene compound.

By aligning the liquid crystal monomer, the alignment of the plate-shape filler 18 in the dam 16 can be further controlled.

The azo-benzene compound has cis/trans isomers such that the structure or the constitution of the azo-benzene compound can be controlled by light irradiation. For example, by generating an isomerization from a cis structure into a trans structure by heat, the alignment of the plate-shape filler 18 in the dam 16 can be further controlled.

<Plate-Shape Filler 18>

The plate-shape filler 18 in the dam 16 is arranged (or aligned) to be non-parallel to the vertical direction of the cross section of the organic electroluminescent device 1. In other words, the plate-shape filler 18 is vertically or obliquely arranged with respect to the top surface of the substrate 11. When the plate-shape filler 18 is arranged to be parallel to the vertical direction of the cross section of the organic electroluminescent device 1, the blocking property against moisture and/or oxygen penetrating along the cross-section direction of the organic electroluminescent device 1 is lowered such that a width of the bezel is required to be increased. However, when the plate-shape filler 18 is arranged to be non-parallel to the vertical direction of the cross section of the organic electroluminescent device 1, the penetrating path of moisture and/or oxygen is increased such that the blocking property against moisture and/or oxygen is improved. As a result, the narrow bezel organic electroluminescent device 1 is provided.

The alignment direction of the plate-shape filler 18 is non-parallel to the vertical direction of the cross section of the organic electroluminescent device 1, but it is preferred that the alignment direction of the plate-shape filler 18 is substantially perpendicular to the vertical direction of the cross section of the organic electroluminescent device 1. In addition, it is preferred that all of the plate-shape fillers 18 are arranged to be perpendicular to the vertical direction of the cross section of the organic electroluminescent device 1. However, considering the production yield and the production cost, an order parameter of the plate-shape filler 18 is controlled.

The plate-shape fillers 18, which are randomly dispersed without any alignment, are controlled to be aligned toward a vertical direction with respect to the vertical direction of the cross section of the organic electroluminescent device 1. It is not necessary that all of the plate-shape fillers 18 are arranged along the same direction.

The order parameter of the plate-shape fillers 18 in the dam 16 may be equal to or greater than 0.5, and beneficially 0.5 to 0.8.

The order parameter can be measured by well-known method. For example, the order parameter can be measured by using the scanning electron Microscope (SEM).

The shape of the plate-shape filler 18 may be an angular plate or a circular plate, but it is not limited thereto.

The plate-shape filler 18 has high aspect ratio. The aspect ratio is a ratio of a length of a major axis (longer side) to a length of a minor axis (shorter side). For example, the plate-shape filler 18 may be formed of clay, mica or talc.

The aspect ratio of the plate-shape filler 18 may be equal to or greater than 10, beneficially equal to or greater than 25 or 50, and more beneficially equal to or greater than 100. There is no limitation in the upper limit of the aspect ratio.

Considering the operating efficiency, the aspect ratio of the plate-shape filler 18 may be equal to or less than 100000. When the plate-shape filler 18 having the aspect ratio being equal to or greater than 10 is used, the blocking property against moisture and/or oxygen is further increased.

For example, a major axis length (diameter) of the plate-shape filler 18 may have a range of 10 nm to 10 μm, but it is not limited thereto.

<Getter 19>

The dam 16 may include the getter 19. The getter 19 is not essential in the dam 16. Moisture and/or oxygen may be absorbed by the getter 19 such that the blocking property of the dam 16 may be further increased due to the getter 19.

A chemical moisture absorbent or a physical absorbent may be used for the getter 19. For example, calcium oxide, barium oxide, strontium oxide, magnesium oxide, lithium sulfate, sodium sulfate, calcium sulfate, magnesium sulfate, cobalt sulfate, gallium sulfate, titanium sulfate, nickel sulfate, zeolite, porous silica, activated carbon or their combination may be used for the getter 19.

<Elastic Spacer 71>

Figure 8:
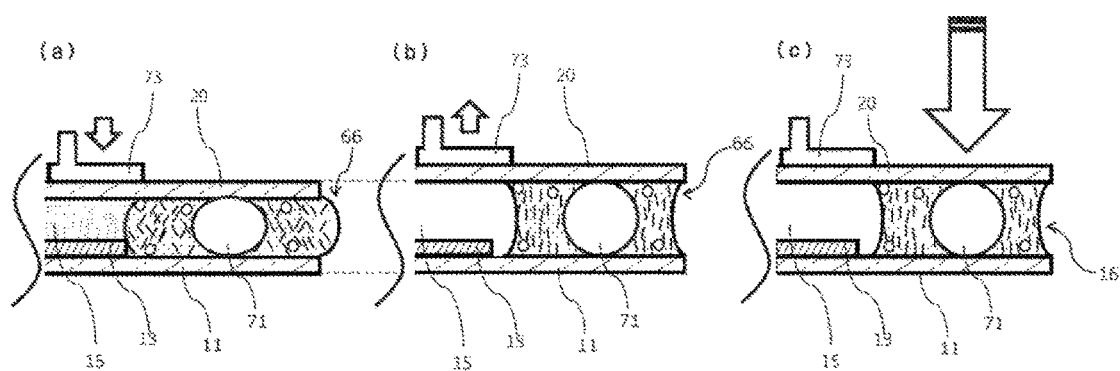
FIG. 8 is a view illustrating an attaching process of two substrates in a fabricating method according to an embodiment of the present disclosure.

The dam 16 may further include the elastic spacer 71 (of FIG. 8). For example, the elastic spacer 71 may be formed of an elastic resin, but it is not limited thereto. Due to the elastic spacer 71 in a dam material solution for forming the dam 16, a gap between the substrate 11 and the counter substrate 20 is secured.

In the attaching process of the substrate 11 and the counter substrate 20, the stress is applied such that the elastic spacer 71 is elastically deformed. As a result, the substrate 11 and the counter substrate 20 are securely attached. Then, the stress is relaxed or removed such that the elastic deformation is recovered. When the elastic deformation is recovered, the disorder of the alignment of the plate-shape filler 18 in the dam material solution resulting from the elastic deformation is also substantially recovered to be closer the original alignment.

In addition, after the stress is relaxed or removed, a center portion of the dam 16 along a vertical direction is concaved. Namely, an inner wall and an outer wall of the dam 16 have a concave shape.

<Additives>

The dam material solution may further include well-known additives. For example, the dam material solution may include a silane coupling agent.

<Counter Substrate 20>

The counter substrate 20 may be a glass substrate. The top-emission type organic electroluminescent display device is provided by using a transparent substrate as the counter substrate 20. The counter substrate 20 faces the substrate 11 and is fixed and adhered on the dam 16. The counter substrate 20 may serve as an encapsulation substrate.

<Filler Layer 15>

The filler layer 15 may fill the enclosed space surrounded by the substrate 11, the counter substrate 20 and the dam 16 to cover or seal the emitting diode 13. Namely, filler 15 layer includes the emitting diode 13 therein. For example, the filler layer 15 may be formed of a transparent resin having a moisture absorbing property.

<Application of Organic Electroluminescent Device>

The organic electroluminescent device disclosed by the present disclosure is applied to a display device or a lighting device.

For example, when the organic electroluminescent device is used as the display device, red, green and blue emitting diodes may be separately positioned in each sub pixel. Alternatively, a color conversion layer and a color filter may be formed at a side of a blue emitting diode to provide red, green and blue colors. In addition, a color filter may be formed at a side of a white emitting diode.

For example, a blue emitting diode is formed in each of the red, green and blue pixels, and a red color conversion layer, which may include a red quantum dot, and a green color conversion layer, which may include a green quantum dot, are respectively formed in the red and green pixels. The blue light from the blue emitting diode is converted into red light by the red color conversion layer in the red pixel, and the blue light from the blue emitting diode is converted into green light by the green color conversion layer in the green pixel. In this instance, the red and green color conversion layers serve as red and green color filters, respectively. As a result, a full-color image can be provided. In addition, red, green and blue color filters may be formed in the red, green and blue pixels, respectively, to improve a color purity. In this instance, the red color conversion layer is disposed between the blue emitting diode in the red pixel and the red color filter, and the green color conversion layer is disposed between the blue emitting diode in the green pixel and the green color filter.

Alternatively, a white emitting diode is formed in each of the red, green and blue pixels, and a red color conversion layer, which may include a red quantum dot, a green color conversion layer, which may include a green quantum dot, and a blue color conversion layer, which may include a blue quantum dot, are respectively formed in the red, green and blue pixels. The white emitting diode may include a first emitting stack, a second emitting stack and a charge generation layer between the first and second emitting stacks. For example, the first emitting stack may emit blue light, and the second emitting stack may emit yellow-green light. Alternatively, the white emitting diode may further include a third emitting stack. When the second emitting stack is disposed between the first and third emitting stacks, another charge generation layer is disposed between the second and third emitting stacks. The white light from the white emitting diode is converted into red light by the red color conversion layer in the red pixel, green light by the green color conversion layer in the green pixel and blue light by the blue color conversion layer in the blue pixel. In this instance, the red, green and blue color conversion layers serve as red, green and blue color filters, respectively. As a result, a full-color image can be provided. In addition, red, green and blue color filters may be formed in the red, green and blue pixels, respectively, to improve a color purity. In this instance, the red color conversion layer is disposed between the white emitting diode in the red pixel and the red color filter, the green color conversion layer is disposed between the white emitting diode in the green pixel and the green color filter, the blue color conversion layer is disposed between the white emitting diode in the blue pixel and the blue color filter.

The organic electroluminescent device may be used as the indoor lighting device, the outdoor lighting device or a light source for an electronic device such as a liquid crystal display device.

The organic electroluminescent device of the present disclosure has excellent blocking property against moisture and/or oxygen and narrow bezel characteristic. Accordingly, the organic electroluminescent device can be used for a flexible organic electroluminescent device or a transparent organic electroluminescent device. In addition, since the blocking property against moisture and/or oxygen is improved by the alignment of the plate-shape filler 18, the amount of the plate-shape filler 18 can be reduced. Accordingly, the amount of the resin in the dam is increased such that the adhesion strength of the dam is improved. Further, the design of the device is improved due to the narrow bezel characteristic.

<Organic Electroluminescent Device (Second Embodiment)>

FIG. 4 is a schematic cross-sectional view of an organic electroluminescent device according to a second embodiment of the present disclosure.

In the organic electroluminescent device 1 of the second embodiment, a metal layer 41 serving as the counter substrate is formed instead of the filler layer 15 and the counter substrate 20 in the organic electroluminescent device 1 of the first embodiment. The dam 16 covers a side surface of the metal layer 41 as well as a side surface of the passivation layer 14.

The organic electroluminescent device 1 of the second embodiment has the same elements as that of the first embodiment except the above features. The explanation of the other elements is omitted.

The organic electroluminescent device 1 of the second embodiment has the same effect as that of the first embodiment.

<Method of Fabricating Organic Electroluminescent Device (Third Embodiment)>

The organic electroluminescent device of the first embodiment is fabricated by following steps.

The method of fabricating the organic electroluminescent device includes (3-1) a step of forming the emitting diode 13 on the substrate 11, (3-2) a step of forming a dam material pattern 66 on the substrate 11 at a periphery of the emitting diode 13 by coating a dam material solution, which includes the resin 17 and the plate-shape filler 18, (3-3) a step of disposing the counter substrate 20 over the emitting diode 13 and on the dam material pattern 66 and (3-4) a step of forming the dam 16 by curing the dam material pattern 66.

In the (3-2) step of forming the dam material pattern 66, the plate-shape filler 18 is aligned to be non-parallel with respect to the vertical direction to the cross section of the organic electroluminescent device 1.

The (3-2) to (3-4) steps in the method of fabricating the organic electroluminescent device are explained in more detail with FIGS. 5 to 8.

The (3-1) step of forming the emitting diode 13 on the substrate 11 may be performed by well-known process. For example, materials for the layers of the emitting diode 13 may be sequentially coated or deposited.

<(3-2) Step of Forming the Dam Material Pattern>

The dam material solution including the resin 17 and the plate-shape filler 18 is coated on the substrate 11 to form the dam material pattern 66 at a periphery of the emitting diode 13. The dam material solution may further include the getter 19 and solvent. The plate-shape filler 18 is aligned to be non-parallel with respect to the vertical direction to the cross section of the organic electroluminescent device 1.

The exemplary aligning method of the plate-shape filler 18 is explained.

<First Method of Aligning Plate-Shape Filler>

Figure 5:
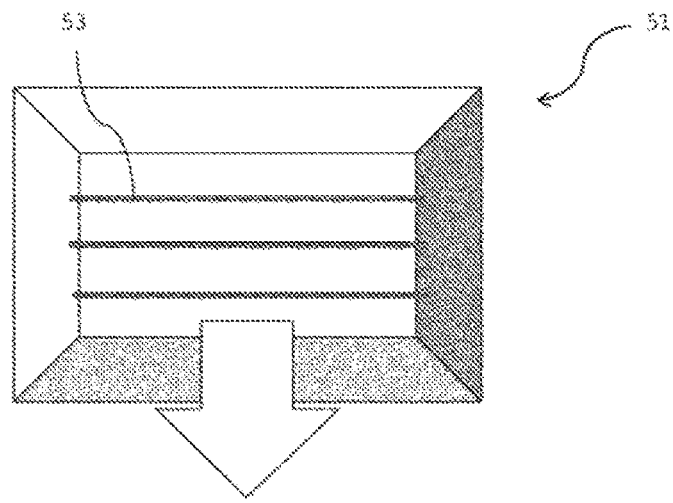
FIG. 5 is a view illustrating a discharging unit used for an exemplary fabricating method of the organic electroluminescent device according to an embodiment.

FIG. 5 is a view illustrating a discharging unit used for an exemplary fabricating method of the organic electroluminescent device. The discharging unit in FIG. 5 includes an outlet having a slit shape.

The discharging unit 51 includes a plurality of outlet 53. The outlet 53 has a slit shape. The dam material solution, which includes the resin 17 and the plate-shape filler 18, is discharged from the outlet 53 onto the substrate 11 (or barrier layer 12). In this instance, since the dam material solution is discharged through the outlet 53 having the slit shape as a narrow opening, the plate-shape filler 18 is aligned along a direction. Namely, the dam material pattern 66 including the plate-shape filler 18, which is aligned along the direction, is formed on the substrate 11 (or barrier layer 12). The direction is non-parallel to a top surface of the substrate 11.

<Second Method of Aligning Plate-Shape Filler>

Figure 6:
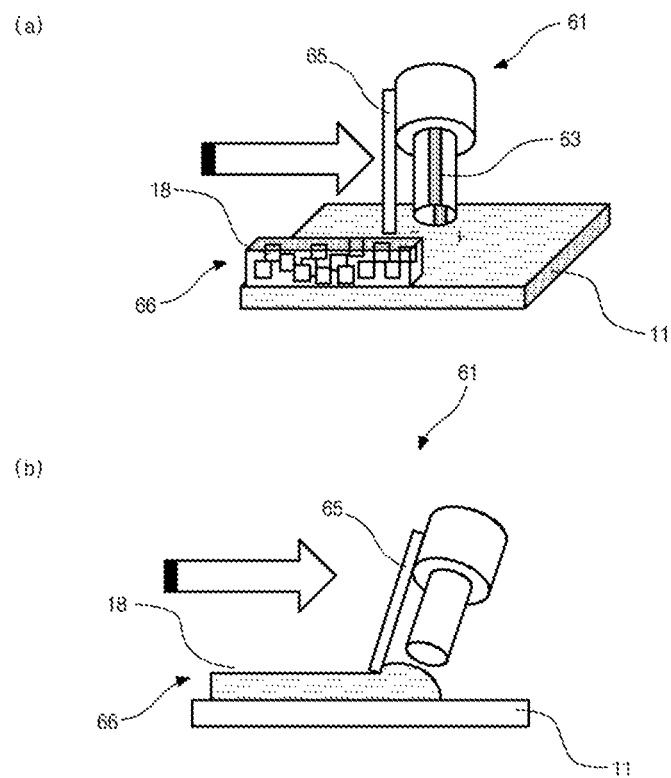
FIG. 6 is a view illustrating an exemplary fabricating method of the organic electroluminescent device according to an embodiment.
Figure 7:
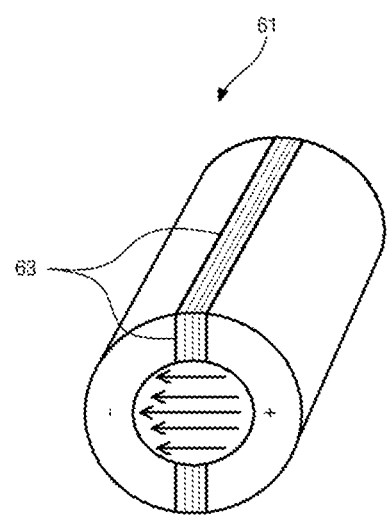
FIG. 7 is a view showing a discharging nozzle used for the fabricating method in FIG. 6 according to an embodiment.

FIG. 6 is a view illustrating an exemplary fabricating method of the organic electroluminescent device, and FIG. 7 is a view showing a discharging nozzle used for the fabricating method in FIG. 6.

As shown in FIG. 6, the dam material pattern 66 is formed on the substrate 11 by using a discharging nozzle 61 being capable of applying an electric field to the dam material solution discharged through the discharging nozzle 61.

When the dam material solution passes through the discharging nozzle, the electric field is applied such that the plate-shape filler 18 in the dam material solution is aligned along a direction.

As shown in FIG. 7, an insulation part 63 is disposed in the discharging nozzle 61. Two electrode parts are disposed at both sides of the insulation part 63 to generate the electric field.

In addition, the dam material pattern 66 is rubbed by a rubbing element 65, which is installed at a side of the discharging nozzle 61, such that the alignment of the plate-shape filler 18 is further improved. The discharging nozzle 61 with the rubbing element 65 moves along an arrow direction to discharge the dam material solution and rub an upper surface of the dam material pattern 66.

As a result, the dam material pattern 66 including the plate-shape filler 18, which is aligned along the direction, is formed on the substrate 11 (or barrier layer 12).

<(3-3) Step of Disposing the Counter Substrate>

FIG. 8 is a view illustrating an attaching process of two substrates in a fabricating method of the present disclosure. FIG. 8(a) shows the device in a state of applying the stress, FIG. 8(b) shows the device in a state of relaxing the stress, and FIG. 8(c) shows the device in a curing process.

In the method of fabricating the organic electroluminescent device 1, the counter substrate 20 is attached with the substrate 11 such that the counter substrate 20 is disposed over the emitting diode 13.

It is preferred that the alignment of the plate-shape filler 18 is not destroyed in the attaching process of the substrate 11 and the counter substrate 20. To maintain the alignment of the plate-shape filler 18, the dam material solution may further include the elastic spacer 71.

As shown in FIG. 8(a), by applying a pre-determined stress onto the counter substrate 20 by a zig 73, the substrate 11 and the counter substrate 20 are securely attached. In this instance, since the stress is also applied to the elastic spacer 71, the elastic spacer 71 is elastically deformed. In FIG. 8(a), the stress is applied onto the counter substrate 20. Alternatively, the stress may be applied onto the substrate 11 or both the substrate 11 and the counter substrate 20.

When the stress is applied, the alignment of the plate-shape filler 18 in the dam material pattern 66 may be partially destroyed or in disorder in comparison to the alignment before the stress is applied.

Next, as shown in FIG. 8(b), the stress by the zig 73 is relaxed such that the elastic deformation is recovered. Alternatively, the stress may be completely removed.

Since the elastic deformation of the elastic spacer 71 is recovered, the destruction or the disorder of the plate-shape filler 18 in the dam material pattern 66 is recovered such that the alignment of the plate-shape filler 18 may be closer the original alignment.

Next, as shown in FIG. 8(c), the dam material pattern 66 is cured such that the substrate 11 and the counter substrate 20 are adhered by the dam 16. The curing process of the dam material pattern 66 may be performed by light irradiation.

<(3-4) Step of Curing the Dam Material Pattern>

The step of curing the dam material pattern 66 to form the dam 16 may be performed by well-known method. For example, the dam material pattern 66 may be cured by using a heating unit or a light irradiation unit.

In FIG. 8(c), the light is scanned onto the counter substrate 20 along a direction. It is preferred that the scanning condition is adjusted to improve or maintain the alignment state of the plate-shape filler 18.

According to the fabricating method of the organic electroluminescent device, the organic electroluminescent device having excellent blocking property against moisture and/or oxygen and the narrow bezel is provided.

<Method of Fabricating Organic Electroluminescent Device (Fourth Embodiment)>

The organic electroluminescent device of the second embodiment is fabricated by following steps.

The method of fabricating the organic electroluminescent device includes (4-1) a step of forming the emitting diode 13 on the substrate 11, (4-2) a step of forming the metal layer 41 as the counter substrate over the emitting diode 13, (4-3) a step of a step of forming a dam material pattern 66 on the substrate 11 at a periphery of the emitting diode 13 and the metal layer 41 by coating a dam material solution, which includes the resin 17 and the plate-shape filler 18 and (4-4) a step of forming the dam 16 by curing the dam material pattern 66.

In the (4-3) step of forming the dam material pattern 66, the plate-shape filler 18 is aligned to be non-parallel with respect to the vertical direction to the cross section of the organic electroluminescent device 1.

The correspondence relation between the fabricating method according to the fourth embodiment and the fabricating method according to the third embodiment is as in the following.

The (4-1) step corresponds to the (3-1) step. The (4-1) step and the (3-1) step are performed by the same process.

The (4-2) step may correspond to the (3-3) step. In the (3-3) step, the prepared counter substrate 20 is attached to the substrate 11. On the other hand, in the (4-2) step, the metal layer 41 as the counter substrate is formed on or over the emitting diode 13. The metal layer 41 may be formed by well-known method.

The (4-3) step may correspond to the (3-2) step. The (4-3) step may be performed by the same process as the (3-2) step except that the dam material pattern 66 covers the side surface of the metal layer 41.

The (4-4) step corresponds to the (3-4) step. The (4-4) step and the (3-4) step are performed by the same process.

According to the fabricating method of the organic electroluminescent device, the organic electroluminescent device having excellent blocking property against moisture and/or oxygen and the narrow bezel is provided.

EXAMPLE

According to the condition of the filler (shape, length "L" [nm], thickness "t" [nm], and L/2t), a volume ratio of the filler ($\phi_c$), a shape of the getter, a volume ratio of the getter ($\phi_g$), a water vapor transmission rate (WVTR) of the resin and a volume ration of the resin ($\phi_p$) in Table 1, the WVTR of the dam is simulated using Nielsen Equation following. The order parameter of the plate-shape filler is 0.5, and an average alignment angle of the plate-shape filler is 55 degree. The getter has a sphere shape having a diameter of 1 nm.

$$P_n = \frac{P_p^* \phi_p}{1 + (L/2t)\phi_c}$$

(Pn: gas transmission rate of the dam, Pp: gas transmission rate of the resin, $\phi_p$: volume ratio of the resin, $\phi_c$: volume ration of the filler, L: average length of single filler, t: average thickness of single filler)

TABLE 1

| | filler | | | | | getter | | resin | | dam | |
|---|---|---|---|---|---|---|---|---|---|---|---|
| | shape | L [nm] | T [nm] | L/2t | $\phi_c$ | shape | $\phi_g$ | WVTR | $\phi_p$ | WVTR | % |
| Ex 1 | plate | 300 | 1 | 150 | 0.1 | — | — | 0.2 | 0.9 | 0.0209 | 10 |
| Ex 2 | plate | 300 | 1 | 150 | 0.2 | — | — | 0.2 | 0.8 | 0.0099 | 20 |
| Ex 3 | plate | 300 | 1 | 150 | 0.3 | — | — | 0.2 | 0.7 | 0.0059 | 34 |
| Ex 4 | plate | 300 | 1 | 150 | 0.1 | sphere | 0.3 | 0.2 | 0.6 | 0.0032 | 63 |
| Ex 5 | plate | 300 | 1 | 150 | 0.2 | sphere | 0.3 | 0.2 | 0.5 | 0.0015 | 133 |
| Ex 6 | plate | 300 | 1 | 150 | 0.3 | sphere | 0.3 | 0.2 | 0.4 | 0.0009 | 223 |
| Ex 7 | plate | 300 | 1 | 150 | 0.1 | sphere | 0.5 | 0.2 | 0.4 | 0.0021 | 96 |
| Ex 8 | plate | 300 | 1 | 150 | 0.2 | sphere | 0.5 | 0.2 | 0.3 | 0.0010 | 202 |
| Ex 9 | plate | 300 | 1 | 150 | 0.3 | sphere | 0.5 | 0.2 | 0.2 | 0.0006 | 340 |
| Ref 1 | sphere | 1 | 1 | 0.5 | 0.3 | — | — | 0.2 | 0.7 | 0.1217 | 2 |
| Ref 2 | sphere | 1 | 1 | 0.5 | 0.5 | — | — | 0.2 | 0.5 | 0.0800 | 3 |
| Ref 3 | sphere | 1 | 1 | 0.5 | 0.8 | — | — | 0.2 | 0.2 | 0.0286 | 7 |
| Ref 4 | — | — | — | | | sphere | 0.3 | 0.2 | 0.7 | 0.0304 | 7 |
| Ref 5 | — | — | — | | | sphere | 0.5 | 0.2 | 0.5 | 0.0200 | 10 |
| Ref 6 | — | — | — | | | sphere | 0.8 | 0.2 | 0.2 | 0.0071 | 28 |

The WVTR simulation value of the dam and the WVTR value of the monomer of the resin (width: 5 mm) are compared, and the rising rate (%) is listed in Table 1.

In comparison to the dam in References 1 to 6, which does not include the plate-shape filler, the dam in Examples 1 to 9, which includes the plate-shape filler, has remarkably high blocking property against moisture and/or oxygen. For example, the blocking property of the dam in Example 3, in which the volume ratio of the plate-shape filler is 30%, is 34 times as the resin monomer.

In addition, although the volume ratio of the filler is decreased, the dam has excellent blocking property.

A dam width (bezel width) in Examples 4 to 9 for having the same blocking property as the related dam, which includes the getter of 80% volume ratio and a width of 5 mm, is calculated and listed in Table 2.

TABLE 2

|      | Bezel width [mm] |
|------|------------------|
| Ex 4 | 2.2              |
| Ex 5 | 1.1              |
| Ex 6 | 0.6              |
| Ex 7 | 1.5              |
| Ex 8 | 0.7              |
| Ex 9 | 0.4              |

The bezel width of Examples 4 to 9 is less than half of the width of the related dam (5 mm). Particularly, the bezel width in Examples 5, 6, 8 and 9 is equal to or less than about 1 mm.

According to the order parameter in Table 3, the blocking property (WVTR) of the dam is simulated using the above Nielsen Equation. The conditions of the filler (plate-shape filler) and the resin are listed in Table 3.

TABLE 3

|       | filler | | | | Order | resin | | dam | |
|-------|-------|-------|------|------|-----------|------|------|------|----|
|       | shape | L [nm] | T [nm] | L/2t | $\phi_c$ | parameter | WVTR | $\phi_p$ | WVTR | % |
| Ex 10 | plate | 300 | 1 | 150 | 0.1 | 0.0 | 10 | 0.9 | 7.1 | 1  |
| Ex 11 | plate | 300 | 1 | 150 | 0.1 | 0.5 | 10 | 0.9 | 1.0 | 10 |
| Ex 12 | plate | 300 | 1 | 150 | 0.1 | 0.6 | 10 | 0.9 | 0.9 | 12 |
| Ex 13 | plate | 300 | 1 | 150 | 0.1 | 0.7 | 10 | 0.9 | 0.8 | 13 |
| Ex 14 | plate | 300 | 1 | 150 | 0.1 | 0.8 | 10 | 0.9 | 0.7 | 15 |
| Ex 15 | plate | 300 | 1 | 150 | 0.1 | 0.9 | 10 | 0.9 | 0.6 | 16 |
| Ex 16 | plate | 300 | 1 | 150 | 0.1 | 1.0 | 10 | 0.9 | 0.6 | 17 |

The rising rate of the WVTR with respect to the dam in Example 10, in which the plate-shape filler has the order parameter of 0.0, is calculated and listed in Table 3.

As shown in Table 3, the blocking property of the dam in Example 11, in which the plate-shape filler has the order parameter of 0.5, is 10 times as the dam in Example 10.

The present disclosure also relates to and is not limited to the following aspects.

In the present disclosure, the plate-shape filler in the dam at one side of the display device is arranged in a first direction, and the plate-shape filler in the dam at the opposite side of the display device is arranged in a second direction.

In the present disclosure, the first direction of the plate-shape fillers in the dam at the one side of the display device is parallel to the second direction of the plate-shape fillers in the dam at the opposite side of the display device.

In the present disclosure, the first direction of the plate-shape fillers in the dam at the one side of the display device is non-parallel to the second direction of the plate-shape fillers in the dam at the opposite side of the display device.

It will be apparent to those skilled in the art that various modifications and variations can be made in the embodiments of the disclosure without departing from the spirit or scope of the disclosure. Thus, it is intended that the modifications and variations cover this disclosure provided they come within the scope of the appended claims and their equivalents.

What is claimed is:

1. A display device, comprising:
    a first substrate;
    an emitting diode on the first substrate;
    a second substrate on the emitting diode; and
    a dam between the first substrate and the second substrate and surrounding the emitting diode, the dam including a resin and plate-shaped fillers,
    wherein the plate-shaped fillers are arranged to be non-parallel to a surface of the first substrate, and
    wherein the plate-shaped fillers in the dam at one side of the display device are arranged in a first direction, and the plate-shaped fillers in the dam at an opposite side of the display device is arranged in a second direction that is non-parallel to the first direction.

2. The display device according to claim 1, wherein the emitting diode includes a blue emitting diode formed in each of a red pixel, a green pixel and a blue pixel in the first substrate.

3. The display device according to claim 2, further comprising a red color conversion layer in the red pixel and a green color conversion layer in the green pixel.

4. The display device according to claim 3, wherein the red color conversion layer includes a red quantum dot and the green color conversion layer includes a green quantum dot.

5. The display device according to claim 3, wherein the blue light from the blue emitting diode is converted into red light by the red color conversion layer in the red pixel, and the blue light from the blue emitting diode is converted into green light by the green color conversion layer in the green pixel.

6. The display device according to claim 2, further comprising a red color filter in the red pixel, a green color filter in the green pixel and a blue color filter in the blue pixel.

7. The display device according to claim 1, wherein the emitting diode includes a white emitting diode including a first emitting stack, a second emitting stack and a charge generation layer between the first emitting stack and the second emitting stack.

8. The display device according to claim 7, wherein the first emitting stack emits blue light and the second emitting stack emits yellow-green light.

9. The display device according to claim 7, wherein the white emitting diode further includes a third emitting stack.

10. The display device according to claim 1, wherein an order parameter of the plate-shaped filler is equal to or greater than 0.5.

11. The display device according to claim 1, wherein a width of the dam is equal to or less than 3 mm.

12. The display device according to claim 1, wherein an aspect ratio of the plate-shaped filler is equal to or greater than 10.

13. The display device according to claim 1, wherein the dam further includes a getter.

14. The display device according to claim 1, wherein the dam further includes an elastic spacer.

15. The display device according to claim 14, wherein an inner wall and an outer wall of the dam has a concave shape.

16. The display device according to claim 14, wherein an inner wall and an outer wall of the dam has a concave shape such that a middle portion of the dam has a width being smaller than both end portions of the dam in a direction perpendicular to the surface of the first substrate.

17. The display device according to claim 1, wherein the dam further includes a liquid crystal monomer or an azo-benzene compound.

18. The display device according to claim 17, wherein the azo-benzene compound has cis/trans isomers.

* * * * *